United States Patent
Ohnuki

(10) Patent No.: US 8,737,031 B2
(45) Date of Patent: May 27, 2014

(54) VOLTAGE MONITORING CIRCUIT, AND VEHICLE EQUIPPED WITH SAME

(75) Inventor: Yasumichi Ohnuki, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 13/977,294

(22) PCT Filed: Aug. 28, 2012

(86) PCT No.: PCT/JP2012/071661
§ 371 (c)(1),
(2), (4) Date: Jun. 28, 2013

(87) PCT Pub. No.: WO2013/038898
PCT Pub. Date: Mar. 21, 2013

(65) Prior Publication Data
US 2013/0279056 A1    Oct. 24, 2013

(30) Foreign Application Priority Data
Sep. 14, 2011    (JP) ................. 2011-200229

(51) Int. Cl.
*H02H 3/00*    (2006.01)

(52) U.S. Cl.
USPC .......................................... 361/86; 361/91.1

(58) Field of Classification Search
None
See application file for complete search history.

(56) References Cited

U.S. PATENT DOCUMENTS

| | | | |
|---|---|---|---|
| 5,859,580 A | 1/1999 | Hashizawa et al. | |
| 6,754,058 B2 * | 6/2004 | Anzawa et al. | 361/91.1 |
| 7,990,669 B2 * | 8/2011 | Yoshikawa et al. | 361/86 |
| 2005/0206386 A1 | 9/2005 | Ishikawa et al. | |
| 2007/0114973 A1 | 5/2007 | Miyamoto | |
| 2008/0164881 A1 * | 7/2008 | Miyamoto | 324/429 |
| 2009/0140743 A1 | 6/2009 | Ohnuki | |
| 2010/0101875 A1 * | 4/2010 | Maeda | 180/65.1 |
| 2010/0231167 A1 * | 9/2010 | Ohnuki | 320/119 |

FOREIGN PATENT DOCUMENTS

| | | |
|---|---|---|
| CN | 1880967 A | 12/2006 |
| DE | 19738772 A1 | 3/1998 |
| JP | 10-83753 A | 3/1998 |
| JP | 2002-315212 A | 10/2002 |
| JP | 2005-044523 A | 2/2005 |
| JP | 2005-292137 A | 10/2005 |
| JP | 2007-139664 A | 6/2007 |
| JP | 2008-086069 A | 4/2008 |
| JP | 2008-151682 A | 7/2008 |

(Continued)

OTHER PUBLICATIONS

International Search Report dated Oct. 30, 2012 corresponding to International Patent Application No. PCT/JP2012/071661.

(Continued)

*Primary Examiner* — Jared Fureman
*Assistant Examiner* — Terrence Willoughby
(74) *Attorney, Agent, or Firm* — Squire Sanders (US) LLP

(57) ABSTRACT

During charging of a cell module in which a plurality of cells are connected in series, a voltage is applied in forward polarity to a switch element even when a current interrupting switch provided to the cell module is open, thereby shorting an anti-fuse element, and the switch element is thereby opened. A voltage monitoring circuit and a vehicle equipped with the voltage monitoring circuit are thereby provided in which a high voltage is not applied even when the cell module is charging when the current interrupting switch is open.

6 Claims, 11 Drawing Sheets

(56) References Cited

FOREIGN PATENT DOCUMENTS

| | | |
|---|---|---|
| JP | 2009-133685 A | 6/2009 |
| JP | 2009-267293 A | 11/2009 |
| JP | 2011-043505 A | 3/2011 |
| JP | 2012-016174 A | 1/2012 |
| WO | WO 2011/069737 A1 | 6/2011 |

OTHER PUBLICATIONS

First Office Action dated Dec. 2, 2013 corresponding to Chinese Patent Application No. 201280004418.9 and English translation thereof.

* cited by examiner

TIME →

VOLTAGE MONITORING CIRCUIT, AND VEHICLE EQUIPPED WITH SAME

TECHNICAL FIELD

The present invention relates to a voltage monitoring circuit for monitoring the voltage of each cell in a battery module (also referred to as a battery assembly), which has a plurality of chargeable and dischargeable secondary cells connected in series, and a current blocking switch connected between at least a pair of adjacent ones of the cells. The present invention also relates to a vehicle incorporating such a voltage monitoring circuit therein.

BACKGROUND ART

Recently, vehicles that are propelled by the drive power of an electric motor, such as electric vehicles (EV), hybrid vehicles (HEV), plug-in hybrid vehicles (PHEV), and fuel cell vehicles (FCV), have incorporated therein a plurality of chargeable and dischargeable secondary cells, which are connected in series and stored as a battery module (battery assembly) in a battery box. The battery module generates a high DC voltage for energizing an electric motor through a motor-energizing inverter.

The voltage, which represents a remaining stored energy level of each cell of the battery module, is monitored at all times by a voltage monitoring circuit.

According to "GUIDELINES FOR ELECTRIC VEHICLE SAFETY-SAE J2344 JUN 1998 (4.3.2.1 Suggested Disconnect Location and Type)," a manual switch (manual disconnect) is required to be added in the vicinity of a midpoint where the voltage of a battery module, which is made up of an array of series-connected cells, is divided into two voltages. When the manual switch is opened, the DC voltage of the battery module is lowered.

There is known an arrangement in which a fuse is integrally combined with a current blocking switch. See, FIG. 1 of Japanese Laid-Open Patent Publication No. 10-083753.

One type of storage battery for use as a battery assembly has contacts, which are opened to cut off an electric current in the event of an undue pressure buildup in the battery, due to gas generated by decomposition of the electrolyte upon overcharging of the battery. See, FIGS. 2 and 4 of Japanese Laid-Open Patent Publication No. 2005-044523, (hereinafter referred to as JP2005-044523A).

According to a known voltage monitoring circuit, the positive and negative terminals of series-connected cells and the voltage monitoring circuit are connected by a number of wires. Differential amplifiers (operational amplifiers) of the voltage monitoring circuit detect voltages of the cells for monitoring the voltages at all times. See, for example, paragraph [0021] and FIG. 1 of Japanese Laid-Open Patent Publication No. 2005-292137 (hereinafter referred to as JP2005-292137A).

If the aforementioned current blocking switch is connected in series to the battery module, then when the current blocking switch is closed, the voltage across each cell is input to the voltage monitoring circuit, which detects the voltage across each cell.

SUMMARY OF INVENTION

As shown schematically in FIG. 10A, while a battery module 102 (having four cells 104 to facilitate understanding) discharges stored electric energy to a load 103, if a current blocking switch 106 (current blocking mechanism) disposed centrally in the battery module 102 and connected in series to the cells 104 is opened as shown in FIG. 10B, then a high voltage (4×V1−V1), which is produced by subtracting the voltage (actually, several volts, for example) across one cell to which the current blocking switch 106 is connected from the total voltage 4×V1 (actually, several hundred volts, for example) across the battery module 102, is reversed in polarity and applied between the input terminals of a voltage detector of the voltage monitoring circuit 112 to which detecting wires 108, 110 are connected on both sides of the current blocking switch 106.

FIG. 11 shows schematically an arrangement in which current blocking switches 116 (current blocking mechanisms) are combined with respective cells 104 of a battery module 122 to which a load 103 is connected. If either one of the current blocking switches 116 is opened, a high voltage similar to the voltage described above is applied to a voltage monitoring circuit 118.

It is possible to determine if the current blocking switches 106, 116 of the voltage monitoring circuits 112, 118 shown in FIGS. 10A, 10B, and 11 are opened, based on the detected voltage falling within an abnormal range, for example. If the detected voltage is judged as falling within an abnormal range, a vehicle control apparatus, not shown, performs a fail-safe process to open a contactor, not shown, that supplies electric power from the battery modules 102, 122 to the load 103, or to shut down an inverter, not shown, that prevents high voltage outside of a rated range from being applied to the voltage monitoring circuits 112, 118.

However, if the current blocking switches 106, 116 are abruptly opened, or if the fuses (not shown) connected in series with the current blocking switches 106, 116 are blown, a high voltage outside of the rated range may be applied to the voltage monitoring circuits 112, 118 before the fail-safe process is initiated.

If such a high voltage is applied between the input terminals of a differential amplifier of the voltage monitoring circuits 112, 118, then there is a possibility that the differential amplifier may become damaged by the high voltage.

The present invention has been made in view of the aforementioned problems. It is an object of the present invention to provide a voltage monitoring circuit, which is capable of preventing application of a high voltage when a current blocking switch in a battery module, which is made up of an array of series-connected cells, is opened. Another object of the present invention is to provide a vehicle that incorporates such a voltage monitoring circuit therein.

According to the present invention, there is provided a voltage monitoring circuit for monitoring voltages across N chargeable and dischargeable series-connected cells of a battery module with a load being connected between a maximum potential and a minimum potential of the battery module, and a current blocking switch being connected between at least a pair of adjacent ones of the cells, wherein N+1 wires are connected from positive terminals and negative terminals of the cells to the voltage monitoring circuit, the voltage monitoring circuit comprising switching elements connected in series to respective ones of the N+1 wires apart from a wire carrying the maximum potential or the minimum potential, the switching elements being openable and closable by control signals from control lines branched from adjacent ones of the respective wires, resistive elements connected in series respectively to the control lines between control input terminals (also referred to as control terminals) of the switching elements and the adjacent ones of the respective wires, and anti-fuse elements connected respectively between the control input terminals and the respective wires, the wires being disconnected and connected when the switching elements are opened and closed.

Among the N+1 wires that extend from the positive terminals and negative terminals of the cells that make up the battery module, with the load connected between the maximum potential and the minimum potential thereof, wires apart from the wire carrying the maximum potential or the minimum potential include the switching elements, which are connected in series and can be opened and closed by control signals from control lines that are branched from adjacent ones of the wires. The resistive elements are connected in series to the control lines between control terminals of the switching elements and the adjacent wires. The anti-fuse elements are connected between the control terminals and the wires, which are disconnected and connected when the switching elements are opened and closed.

While the battery module is discharged with the current blocking switch thereof being open, the switching elements are opened when voltages of reverse polarity are applied to the switching elements. While the battery module is charged with the current blocking switch thereof being open, the anti-fuse elements are short-circuited if voltages of normal polarity are applied to the switching elements, thereby opening the switching elements. Therefore, when the switching elements are opened, a high voltage is not applied to the voltage monitoring circuit during charging and discharging of the battery module.

If capacitors are connected in parallel with the respective resistive elements, the anti-fuse elements can be short-circuited smoothly.

The switching elements may comprise semiconductor switches that are closed when positive voltages are applied to the control input terminals. The semiconductor switches may be connected to the N wires apart from the wire carrying the maximum potential, and may be closed by potentials of the control lines that are branched from adjacent wires of higher potentials.

Alternatively, the switching elements may comprise semiconductor switches that are closed when negative voltages are applied to the control input terminals, and the semiconductor switches may be connected to the N wires apart from the wire carrying the minimum potential, and may be closed by potentials of the control lines that are branched from adjacent wires of lower potentials.

Further, a charging unit (charger) for charging the battery module may be connected between the maximum potential and the minimum potential of the battery module.

The present invention also covers a vehicle, which incorporates therein the above voltage monitoring circuit. The vehicle may be a vehicle that can be propelled by drive power from at least an electric motor, e.g., an electric vehicle (EV), a hybrid vehicle (HEV), a plug-in hybrid vehicle (PHEV), or a fuel cell vehicle (FCV).

According to the present invention, the battery module includes the switching elements and the anti-fuse elements. Thus, even if the current blocking switch included in the battery module, which is made up of a string of series-connected cells, is opened, a high voltage is not applied to the voltage monitoring circuit.

DESCRIPTION OF EMBODIMENTS

Embodiments of the present invention in relation to vehicles that incorporate the embodiments therein will be described below with reference to the drawings.

Figure 1:
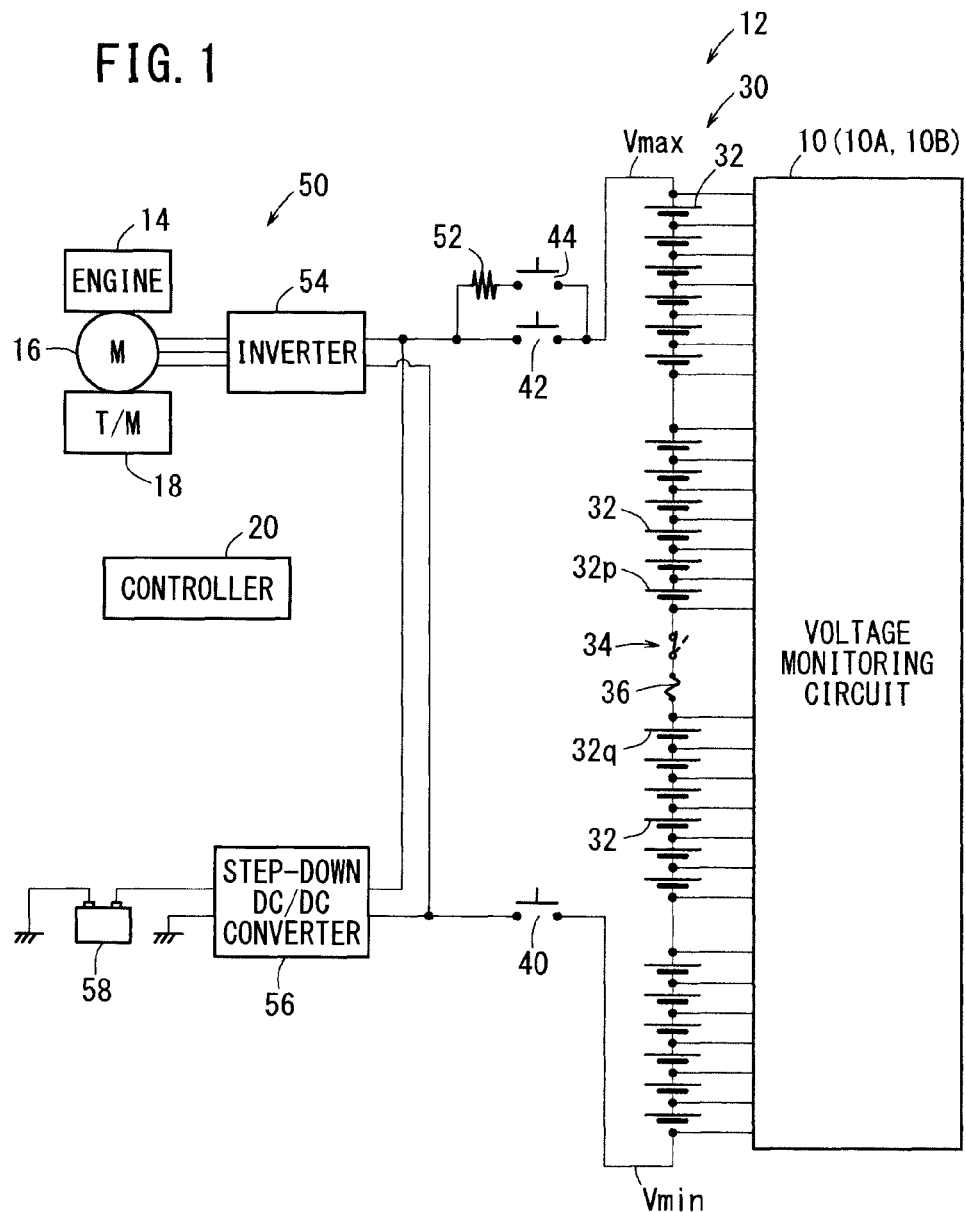
FIG. 1 is an electric circuit diagram of a hybrid vehicle incorporating therein a voltage monitoring circuit according to an embodiment of the present invention.

FIG. 1 shows schematically a hybrid vehicle (HEV) 12 incorporating a voltage monitoring circuit 10 according to an embodiment of the present invention.

The HEV 12 is a motor-assisted hybrid vehicle including an engine 14 that is integrally connected, via a crankshaft (not shown), with a motor (M) 16, which functions both as a motor (electric motor) and a generator (electricity generator), and a transmission (T/M) 18. The transmission 18 produces output power to actuate drive wheels (not shown).

A controller 20 is connected to various components of the HEV 12 including the voltage monitoring circuit 10. The controller 20 controls the HEV 12 comprehensively, and also controls a battery module 30 during charging and discharging of the battery module 30.

The battery module 30, which serves as a battery assembly, comprises an array of N series-connected cells 32, which are chargeable and dischargeable secondary cells. The battery module 30 includes a series-connected circuit made up of a current blocking switch 34, which is used as a maintenance switch, and a fuse 36. The current blocking switch 34 and the fuse 36 are disposed between at least a pair of adjacent cells 32$p$, 32$q$ in the vicinity of a potential midpoint. The current blocking switch 34 is normally closed unless the battery module 30 is being serviced for maintenance.

A load 50 is connected through contactors 40, 42, 44 between a maximum potential Vmax and a minimum potential Vmin of the battery module 30. The contactor 44 is connected in series to a known type of resistive component 52 for blocking an excessive inrush current.

The load 50 includes the motor 16 and an inverter 54, i.e., a voltage converter for converting between a DC voltage and a three-phase AC voltage. The inverter 54 has a DC side, which is connected to a +12V low-voltage battery 58 through a step-down DC/DC converter 56.

When the motor 16 operates in a power mode, the battery module 30 supplies electric power to the motor 16 through the contactors 40, 42 and the inverter 54. At this time, the battery module 30 is in a discharge mode. When the motor 16 operates in a regenerative mode, such as when the HEV 12 is decelerated, the motor 16 supplies generated electric power to the battery module 30 through the inverter 54 and the contactors 40, 42. At this time, the battery module 30 is in a charge mode.

Figure 2:
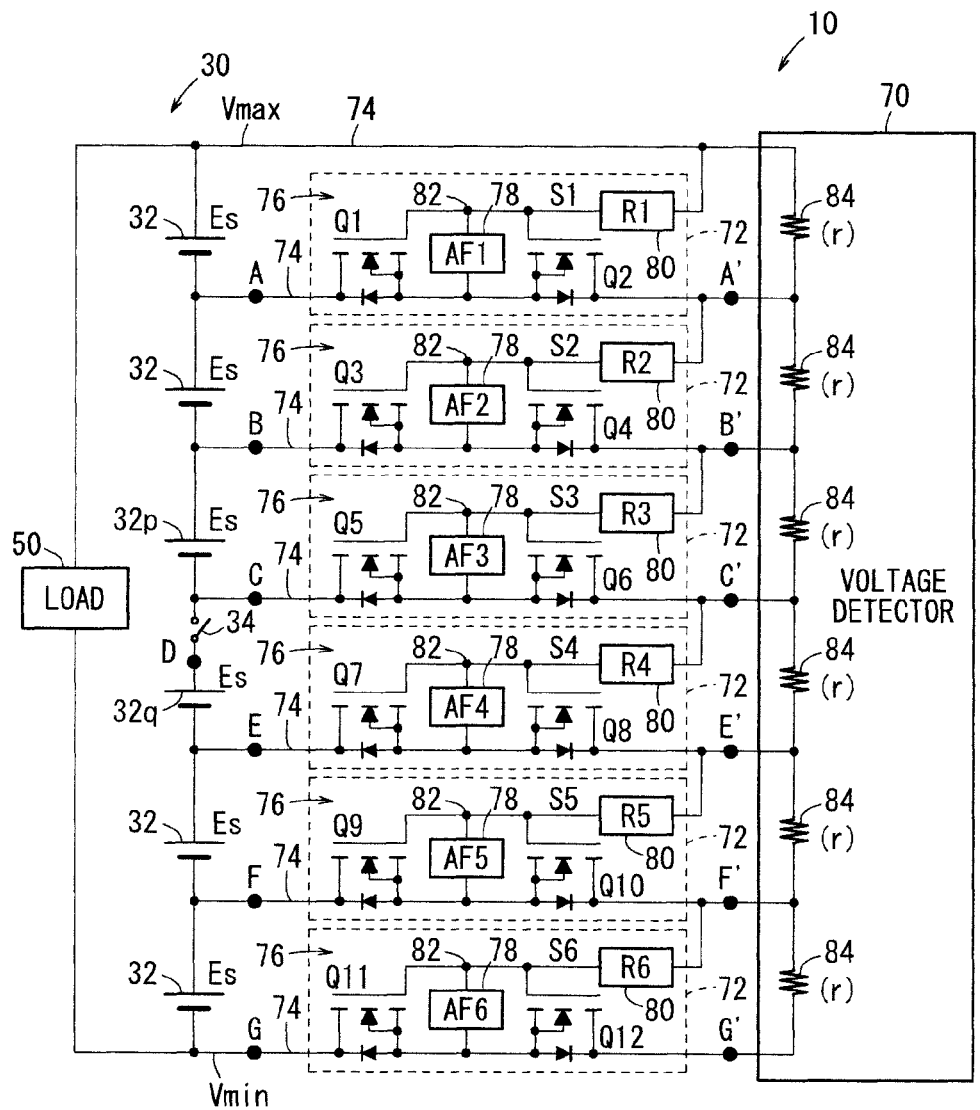
FIG. 2 is an electric circuit diagram of the voltage monitoring circuit according to the embodiment.

FIG. 2 shows an arrangement of the voltage monitoring circuit 10. In FIG. 2, to facilitate understanding, the battery module 30 is illustrated with the fuse 36 being omitted from illustration. As illustrated, the battery module 30 comprises six cells 32 including the adjacent cells 32p and 32q. The voltage (electromotive force) across each cell 32 is referred to as a cell voltage (voltage) Es. In FIG. 2, the battery module 30 and the load 50 are shown as being connected to each other, while the contactors 40, 42 shown in FIG. 1 (which are omitted from illustration in FIG. 2) are in a closed state.

The voltage monitoring circuit 10 comprises a voltage detector 70 including differential amplifiers and A/D converters, not shown, and N (six) semiconductor switch blocks 72. In the voltage detector 70, resistors 84, each of which has a resistance value r, represent internal impedance components (actually, a parallel-connected circuit made up of distributed capacitors and the resistors 84 having resistance values r). The resistors 84 will hereinafter also be referred to as internal impedance components 84.

The load 50, which includes the inverter 54 and the motor 16, is connected between the maximum potential Vmax and the minimum potential Vmin of the battery module 30. The cells 32 of the battery module 30 each have positive terminals and negative terminals from which there extend N+1 (6+1) wires (also referred to as voltage detection wires) that are connected to the voltage detector 70.

Among the N+1 wires, N wires 74 are connected to the respective semiconductor switch blocks 72, which are inserted in series therewith. If the semiconductor switch blocks 72 comprise n-type MOSFETs, as shown in FIG. 2, then the wire 74 carrying the maximum potential Vmax is connected directly to the voltage detector 70, whereas the other wires (wire A-A', wire B-B', wire C-C', wire E-E', wire F-F', and wire G-G') apart from the wire 74 carrying the maximum potential Vmax are connected respectively to the series inserted semiconductor switch blocks 72.

The semiconductor switch blocks 72 including the circuit constants thereof are identical in structure. More specifically, the semiconductor switch blocks 72 each comprise switching elements 76, anti-fuse elements 78 (AF1 through AF6), and resistive elements 80 (R1 through R6). The switching elements 76 comprise two n-type MOSFETs, which are rendered conductive when the gate electrodes are placed at a positive potential with respect to the source electrodes (Q1 and Q2, Q3 and Q4, Q5 and Q6, Q7 and Q8, Q9 and Q10, Q11 and Q12, also referred to as Qn and Qn+1). The source electrodes and the gate electrodes of each of the n-type MOSFETs are connected in common, one of the two n-type MOSFETs having a drain electrode connected to the cell 32 (nodes A through C, nodes E through G), and the other of the two n-type MOSFETs having a drain electrode connected to the voltage detector 70 (nodes A' through C', nodes E' through G'). Parasitic diodes are provided in directions from the source electrodes to the drain electrodes of each of the n-type MOSFETs Qn, Qn+1. The two n-type MOSFETs Qn, Qn+1 of each of the switching elements 76 are reverse-connected in series to each other. The switching elements 76 will hereinafter also be referred to as reverse-connected series nMOSFETs Qn, Qn+1.

The anti-fuse element 78 is connected between the commonly connected source and gate electrodes of the switching elements 76 (reverse-connected series nMOSFETs Qn, Qn+1). The resistive element 80 (R1 through R6) is connected between the commonly connected gate electrodes and the wire 74, which carries a potential that is one level higher.

Each of the anti-fuse elements 78 is an element the resistance value of which changes irreversibly from a high level to a low level when the voltage across the element exceeds a threshold voltage Vth. According to the present embodiment, the voltage across the anti-fuse element 78 does not exceed the threshold voltage Vth while the current blocking switch 34 is closed.

As shown in FIG. 2, the commonly connected gate electrodes of each of the switching elements 76 function as control terminals (also referred to as control input terminals) 82. The switching elements 76 are controlled so as to open and close, i.e., the reverse-connected series nMOSFETs Qn, Qn+1 are turned on and off, depending on the level of the control signals S1 through S6, which are supplied (applied) through the resistive elements 80 to the control terminals 82.

When the switching elements 76 are closed, i.e., when the wire A-A', the wire B-B', . . . , the wire F-F', and the wire G-G' exhibit a low resistance (when the switching elements 76 are turned on), it is possible to detect the voltages Es of the respective cells 32. The resistors (input resistors) 84 of the voltage detector 70, each of which has a resistance value r, are connected in parallel with the respective cells 32. Therefore, cell voltages Es of the respective cells 32 appear across the resistors 84 and are detected by the voltage detector 70.

Figure 3:
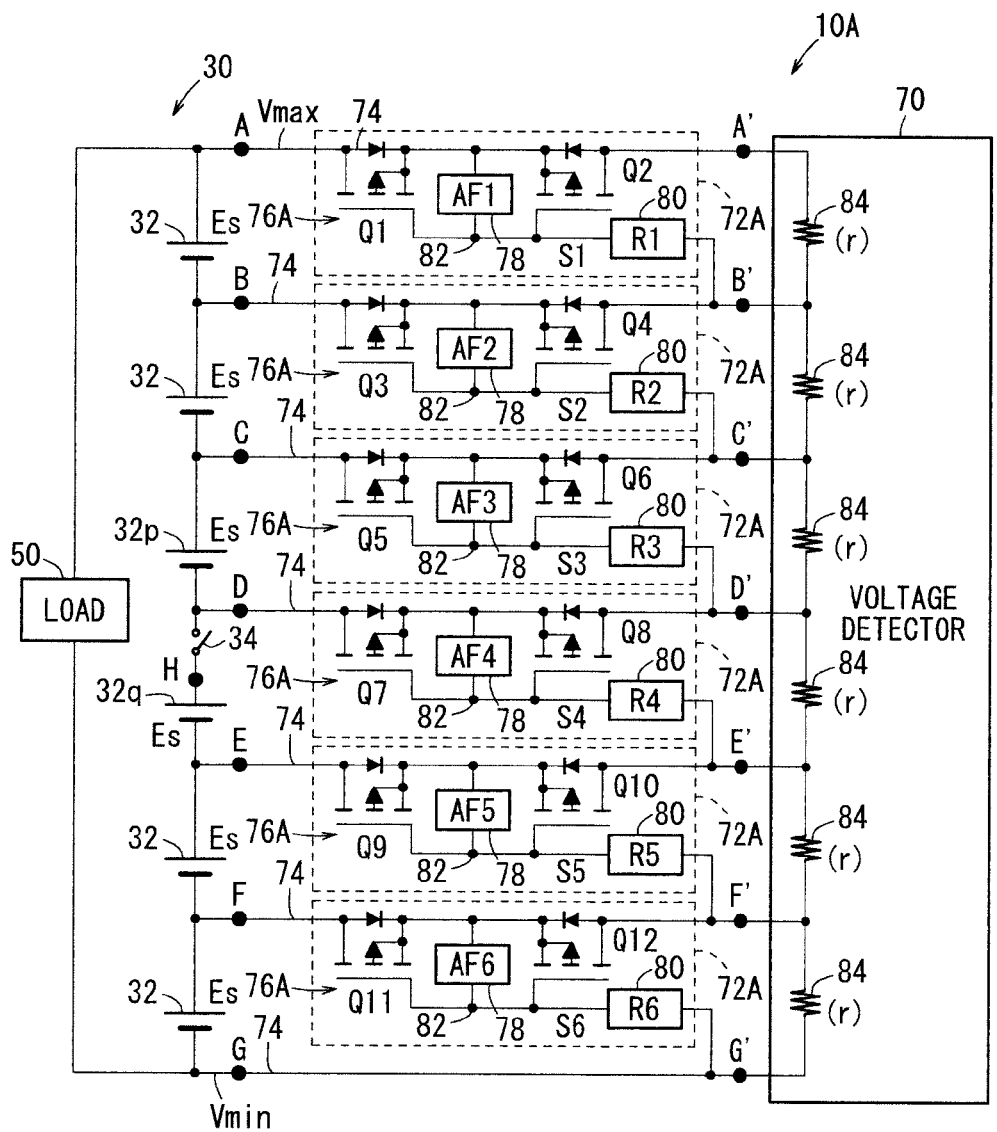
FIG. 3 is an electric circuit diagram of a voltage monitoring circuit according to a modification of the embodiment.

If each of the switching elements 76 comprises a p-type MOSFET, which is rendered conductive (turned on or closed) when a negative potential is applied thereto, i.e., is rendered conductive when the gate electrodes go to a negative potential with respect to the source electrodes, then as indicated by the modification shown in FIG. 3, a voltage monitoring circuit 10A comprises semiconductor switch blocks 72A, each of which includes respective switching elements 76A, i.e., reverse-connected series pMOSFETs Qn, Qn+1, which are connected to respective N voltage detection lines inserted therein, apart from the voltage detection line that carries the minimum potential Vmin. Negative voltages are applied as control signals S1 through S6 through the resistive elements 80 to the switching elements 76A from adjacent wires that carry negative potentials.

Operations of the voltage monitoring circuit 10 according to the above-described embodiment, i.e., (I) a protective mode of operation of the voltage monitoring circuit 10 at a time that the battery module 30 is discharged, and (II) a protective mode of operation of the voltage monitoring circuit 10 at a time that the battery module 30 is charged (charged in the regenerative mode), will be described below.

(I) Protective Mode of Operation of Voltage Monitoring Circuit 10 During Discharging of Battery Module 30

In FIGS. 1 and 2, when the battery module 30 is discharged and as a current flows or is supplied from the battery module 30 to the load 50, such as when the motor 16 is in the power mode with the current blocking switch 34 in a closed state, positive potentials Es are applied as control signals S1 through S6 to the respective control terminals 82 (the commonly connected gate electrodes of the reverse-connected series nMOSFETs Qn, Qn+1) through the resistive elements 80 from adjacent wires that carry positive potentials. Therefore, the switching elements 76 are closed, and voltages Es are allowed to appear across the respective cells 32, which are measured by the voltage detector 70. While the voltages Es are applied, the voltages applied across the anti-fuse elements 78 (AF1 through AF6) are lower than the threshold voltage Vth, and hence the anti-fuse elements 78 exhibit a high resistance value.

The voltage monitoring circuit 10 operates in the following manner when the current blocking switch 34 is opened and during discharging of the battery module 30 with a current flowing from the battery module 30 to the load 50.

Figure 10A:
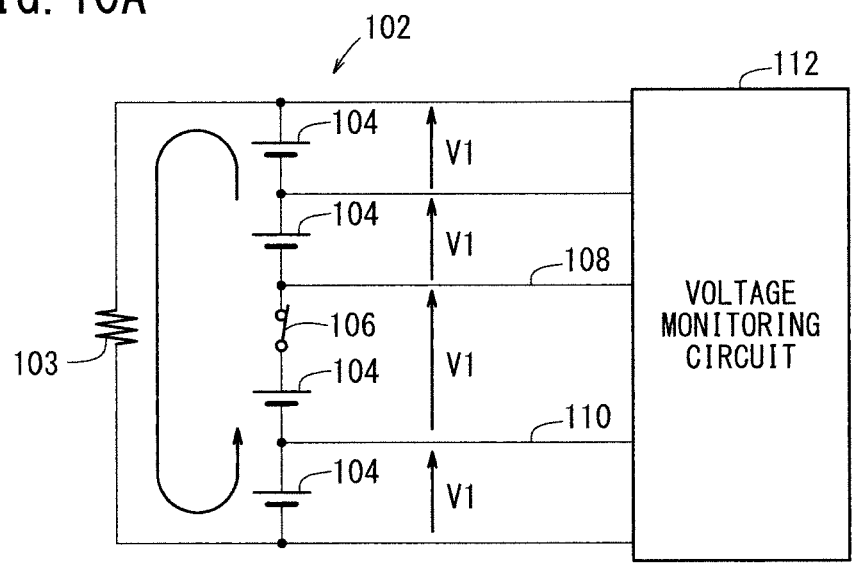
FIG. 10A is a circuit diagram for describing problems of the background art, with a current blocking switch being shown in a closed state.
Figure 10B:
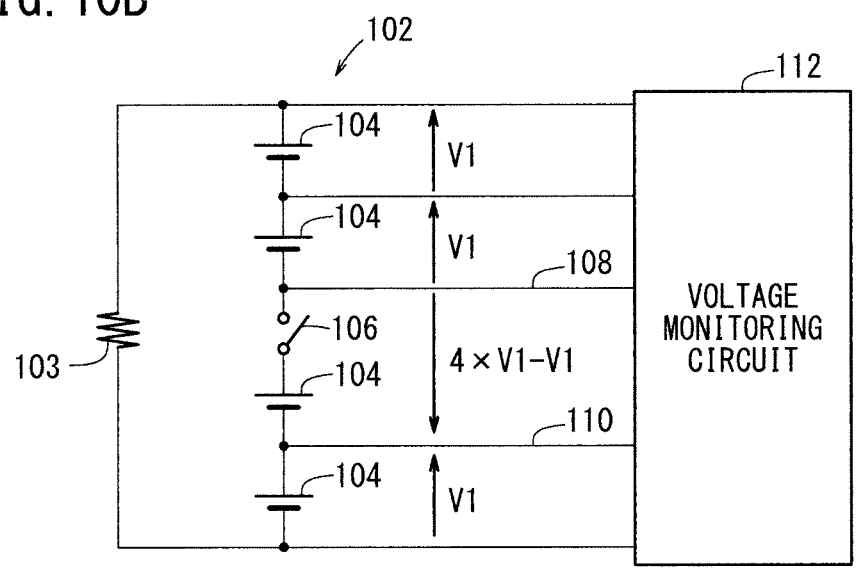
FIG. 10B is a circuit diagram for describing problems of the background art, with the current blocking switch being shown in an open state.
Figure 11:
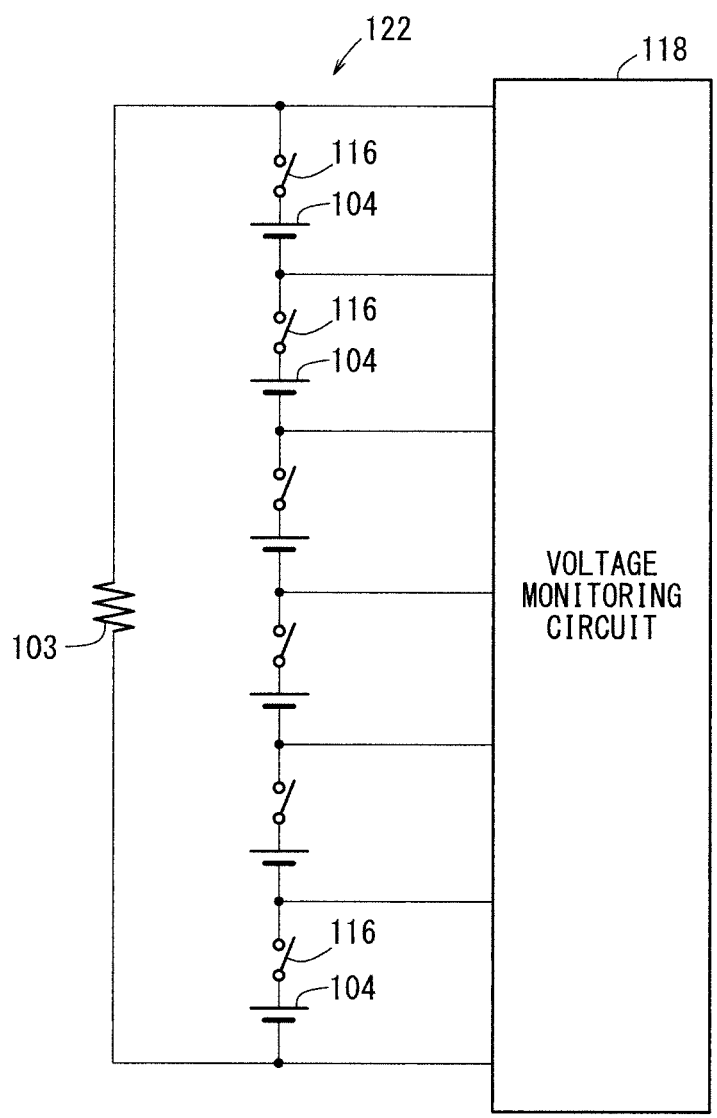
FIG. 11 is a circuit diagram of an arrangement in which current blocking switches are combined with respective cells of a battery module.

At the time that the current blocking switch 34 is opened, the switching elements 76 (reverse-connected series nMOS-FETs Qn, Qn+1), which are connected in series respectively to the wire A-A', the wire B-B', the wire C-C', the wire F-F', and the wire G-G', remain closed (turned on). As described above with reference to FIG. 10B, a reverse voltage (N−1) Es=5Es is applied between the node C and the node E, while the node C is kept at a reference potential 0 [V].

When the potential of the wire E-E' changes from −Es to +5Es and while the potential of the wire C-C' is kept at 0 [V], the potential of the gate electrodes (control terminal 82) of the nMOSFETs Q7, Q8 becomes lower than the potential of the source electrodes (wire E-E') through the resistive element 80 (R4). Therefore, the switching element 76 (nMOSFETs Q7, Q8) of the semiconductor switch block 72, which is connected in series to the wire E-E', changes from a closed state to an open state.

The potential at the node E' (i.e., a potential +2Es produced by dividing the potential +4Es of the node F' as compared with the reference potential at the node C' by the resistance values r, r between the node C' and the node F') becomes lower than the potential of the wire F-F', i.e., the potential +4Es as compared with the reference potential at the node C'. Therefore, the switching element 76 (nMOSFETs Q9, Q10) of the semiconductor switch block 72, which is connected in series to the wire F-F', changes from a closed state to an open state. Similarly, the switching element 76 (nMOSFETs Q11, Q12) of the semiconductor switch block 72, which is connected in series to the wire G-G', changes from a closed state to an open state.

When the current blocking switch 34 is opened and during discharging of the battery module 30, the switching elements 76 connected respectively to the wire E-E', the wire F-F', and the wire G-G' are opened instantaneously. Therefore, the potential (N−1)Es=5Es applied to the wire E-E', as compared with the reference potential of the wire C-C', is not applied between the node C' and the node E'. Therefore, the voltage detector 70 can be protected from exposure to the high voltage.

(II) Protective Mode of Operation of Voltage Monitoring Circuit 10 During Charging (in Regenerative Mode) of the Battery Module 30

When the current blocking switch 34 is closed while the motor 16 is in the regenerative mode, such that a current flows or is supplied from the load 50 to the battery module 30 in order to charge the battery module 30, positive voltages are applied respectively as control signals S1 through S6 through the resistive elements 80 to the control terminals 82 from adjacent wires that carry positive potentials. Therefore, the switching elements 76 are placed in a closed state, and voltages Es are allowed to appear across the respective cells 32, which are measured by the voltage detector 70. While the voltages Es are applied to the resistors 84 of the voltage detector 70 during charging of the battery module 30, the voltages applied across the anti-fuse elements 78 (AF1 through AF6) are lower than the threshold voltage Vth, and hence the anti-fuse elements 78 exhibit a high resistance value, so that the anti-fuse elements 78 do not adversely affect detection of the cell voltages Es by the voltage detector 70.

The voltage monitoring circuit 10 operates in the following manner when the current blocking switch 34 is opened and during charging of the battery module 30, with current flowing from the load 50 (regenerative power supply) to the battery module 30.

Figure 4:
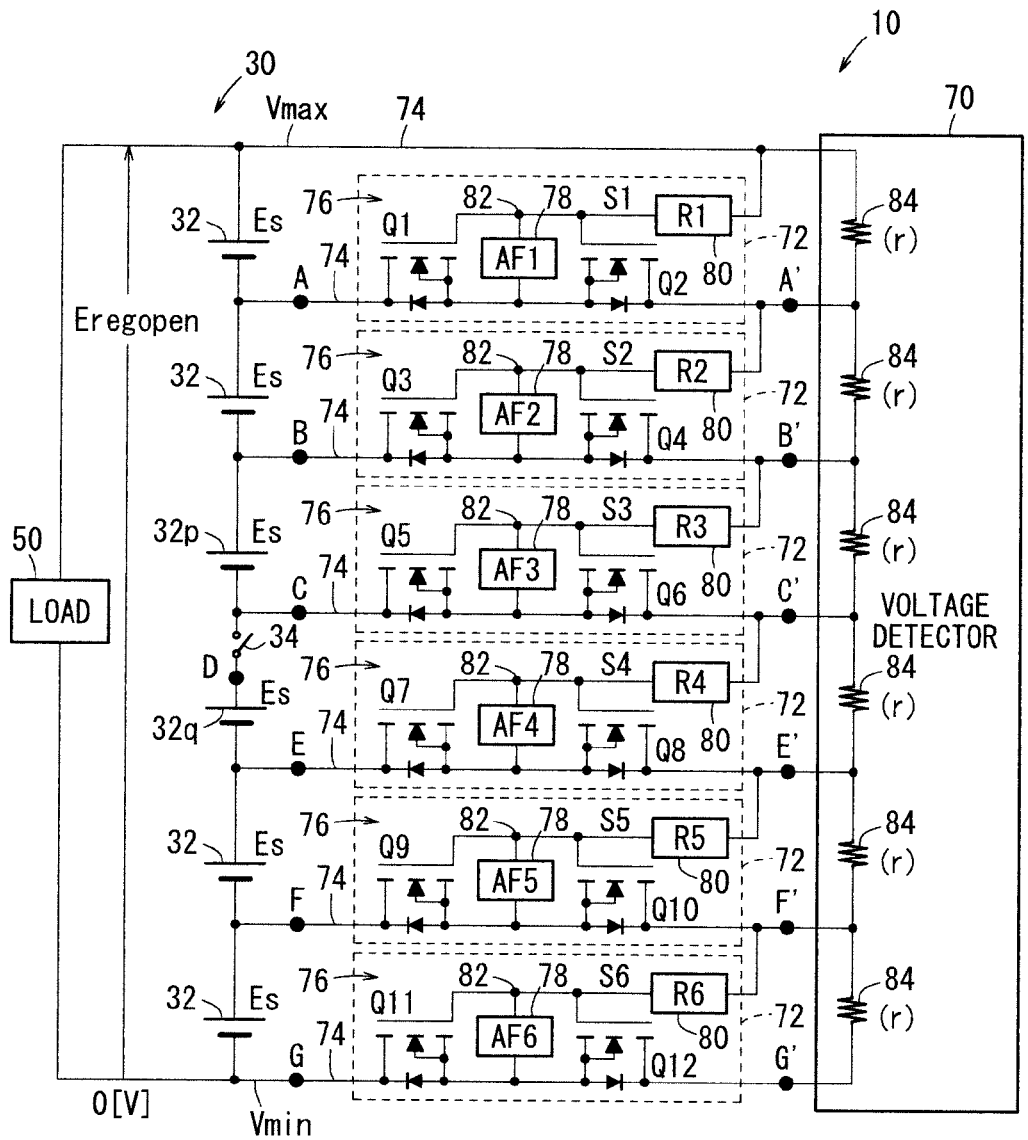
FIG. 4 is an electric circuit diagram showing how the voltage monitoring circuit according to the embodiment operates during charging of a battery module.

If the current blocking switch 34 is opened, the charging current from the load 50 stops flowing to the battery module 30. At this time, as shown in FIG. 4, an open-circuit voltage Eregopen, which is a regenerated voltage from the load 50, is applied across the battery module 30.

In general, the open-circuit voltage Eregopen may occasionally go higher than the voltage 6×Es [V] (inter-terminal voltage Vmax−Vmin) across the battery module 30 (Eregopen>>6×Es). If the node G shown in FIG. 2 (FIG. 4) is at the reference potential 0 [V], then a potential Eregopen−3×Es is developed on the line C-C', i.e., at the node C, whereas a potential of only 2×Es is developed on the line E-E', i.e., at the node E, as compared with the reference potential 0 [V] at the node G. The potential Eregopen−3×Es on the line C-C', i.e., at the node C, is significantly higher than the potential 2Es on the line E-E', i.e., at the node E ((Eregopen−3×Es)>>2Es).

As a result, the potential at the node C', to which one end of the resistive element 80 (R4) is connected, tends to be higher than the potential of the wire E-E'. The voltage, i.e., the potential of the control signal S4, which is applied to the control terminal 82 or to the commonly connected gate electrodes of the nMOSFETs Q7, Q8 of the switching element 76 connected to the wire E-E', remains positive, thus keeping the switching element 76, i.e., the nMOSFETs Q7, Q8, in a closed state. In the absence of the anti-fuse element 78 (AF4), the potential difference between the potential 2Es of the wire E-E' and the potential at the node C', which increases to the potential Eregopen−3Es, increases beyond an input withstand voltage Vinmax occurring between the node C' and the node E', which can cause damage to the voltage detector 70.

Figure 6A:
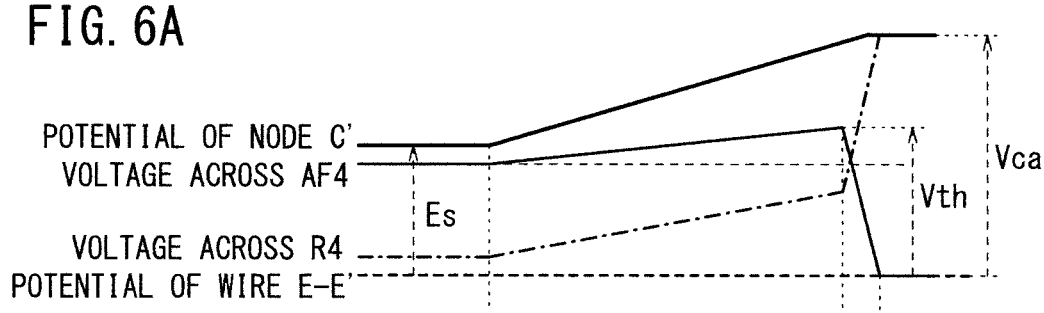
FIG. 6A is a waveform diagram showing operations of the voltage monitoring circuits illustrated in FIGS. 2 and 3.

However, the voltage monitoring circuit 10 shown in FIG. 2 (FIG. 4) includes the anti-fuse element 78 (AF4). Therefore, when the voltage applied to the control terminal 82 of the switching element 76, i.e., the commonly connected gate electrodes of the nMOSFETs Q7, Q8, increases, that is, when the potential at the node C' increases with respect to the potential of the wire E-E', and when the voltage across the anti-fuse element 78 (AF4) becomes higher than the threshold voltage Vth, the resistance of the anti-fuse element 78 (AF4) changes quickly and irreversibly from a high level to a low level (see times t3, t4 in FIG. 6A).

When the resistance of the anti-fuse element 78 (AF4), which is connected between the gate and source electrodes of the switching element 76, i.e., the nMOSFETs Q7, Q8, changes to a low level, since the voltage between the gate and source electrodes of the nMOSFETs Q7, Q8 becomes substantially 0 [V], the switching element 76, which is connected to the wire E-E', changes from a closed state (turned-on state) to an open state (turned-off state). Since the nodes E, E' are connected to each other only by the parasitic diodes, which are reverse-connected in series with each other, the switching element 76 is fully opened.

Since conduction between the nodes E, E' is broken, the potential at the node E' changes to a potential capable of being determined by a voltage dividing ratio, depending on the voltage between the node C' and the node F' and the internal impedance components 84 of the voltage detector 70.

The voltage, i.e., the potential difference, between the node E' and the wire F-F' increases, thereby rendering the anti-fuse element 78 (AF5) conductive and opening the switching element 76 (nMOSFETs Q9, Q10). Similarly, the anti-fuse element 78 (AF6) is rendered conductive to open the switching element 76 (nMOSFETs Q11, Q12).

When the current blocking switch 34 is closed during charging of the battery module 30, the switching elements 76 including the anti-fuse elements 78 (AF4, AF5, AF6) are placed in an open state. As a result, a high voltage is not applied to the nodes E', F', G' or to the voltage detector 70, and thus the voltage detector 70 is protected. Stated otherwise, when a high voltage is about to be applied between the input terminals of the voltage detector 70, i.e., across the resistors 84, the anti-fuse elements 78 are rendered conductive by a relatively low voltage, i.e., the threshold voltage Vth. Therefore, the high voltage is not applied to the voltage detector 70, and the voltage detector 70 is protected.

The voltage monitoring circuit 10A shown in FIG. 3, which incorporates pMOSFETs therein that are rendered conductive when the potential of the gate electrodes becomes negative with respect to the potential of the source electrodes, i.e., which incorporates switching elements 76A that are rendered conductive by a negative potential, also is protected during charging and discharging of the battery module 30, in the same manner as the voltage monitoring circuit 10 (FIGS. 2 and 4) that incorporates nMOSFETs therein. Operations of the voltage monitoring circuit 10A shown in FIG. 3, i.e., (III) a protective mode of operation of the voltage monitoring circuit 10A at a time that the battery module 30 is discharged and (IV) a protective mode of operation of the voltage monitoring circuit 10A at a time that the battery module 30 is charged (in the regenerative mode), will be described below.

(III) Protective Mode of Operation of Voltage Monitoring Circuit 10A during Discharging of the Battery Module 30

In FIG. 3, when the battery module 30 is discharged and a current flows or is supplied from the battery module 30 to the load 50, such as when the motor 16 is in the power mode with the current blocking switch 34 being closed, negative potentials −Es are applied through the resistive elements 80 as control signals S1 through S6 to the respective control terminals 82 from adjacent wires that carry negative potentials. Therefore, the switching elements 76A are closed, and voltages Es are allowed to appear across the respective cells 32, which are measured by the voltage detector 70. While the voltages −Es are applied, the voltages applied across the anti-fuse elements 78 (AF1 through AF6) are lower than the threshold voltage Vth, and hence the anti-fuse elements 78 exhibit a high resistance value.

The voltage monitoring circuit 10A operates in the following manner when the current blocking switch 34 is opened and while the battery module 30 is being discharged with a current flowing from the battery module 30 to the load 50.

At the time that the current blocking switch 34 is opened, the switching elements 76A (reverse-connected series pMOSFETs Qn, Qn+1), which are connected in series to the wire A-A', the wire B-B', the wire C-C', the wire D-D', and the wire F-F', respectively, remain closed (turned on). As described above with reference to FIG. 10B, as compared with the reference potential 0 [V] on the wire D-D', the potential of the wire E-E' changes from −Es to (N−1)Es=5Es. Due to the change in potential, the switching element 76A (pMOSFETs Q7, Q8) connected to the wire D-D' changes from a closed state to an open state.

When the switching element 76A (pMOSFETs Q7, Q8) changes from a closed state to an open state, the potential at the node D' changes from 0 [V] to +3Es (i.e., a potential produced by dividing the potential +5Es of the node E' and the potential Es of the node D' by the internal impedance components 84 (r, r) of the voltage detector 70 between the node C' and the node E'), thereby changing the switching element 76A (pMOSFETs Q5, Q6) that is connected to the wire C-C' from a closed state to an open state through the resistive element 80 (R3).

When the switching element 76A (pMOSFETs Q5, Q6) changes from a closed state to an open state, the potential at the node C' changes from +Es to +3Es (i.e., a potential produced by dividing the potential +5Es of the node E' and the potential +2Es of the node B' by the internal impedance components 84 (r, r) of the voltage detector 70 between the node B' and the node E'), thereby changing the switching element 76A (pMOSFETs Q3, Q4) that is connected to the wire B-B' from a closed state to an open state through the resistive element 80 (R2).

When the switching element 76A (pMOSFETs Q3, Q4) changes from a closed state to an open state, the potential at the node B' changes from +2Es to +3.5Es (i.e., a potential produced by dividing the potential +5Es of the node E' and the potential +3Es of the node A' by the internal impedance components 84 (r, r, r, r) of the voltage detector 70 between the node A' and the node E'), thereby changing the switching element 76A (pMOSFETs Q1, Q2) that is connected to the wire A-A' from a closed state to an open state through the resistive element 80 (R1).

In as much as the switching elements 76A, which are connected respectively to the wire E-E', the wire D-D', the wire C-C', the wire B-B', and the wire A-A', are placed in an open state, as compared with the reference potential at the node D', the potential (N−1)Es=5Es applied to the node E is not applied between the node D' and the node E'. Therefore, the voltage detector 70 can be protected from exposure to the high voltage.

(IV) Protective Mode of Operation of Voltage Monitoring Circuit 10A During Charging of the Battery Module 30

When the current blocking switch 34 is closed and the motor 16 is in the regenerative mode, such that a current flows or is supplied from the load 50 to the battery module 30 in order to charge the battery module 30, negative voltages are applied as control signals S1 through S6 through the resistive elements 80 to the respective control terminals 82 from adjacent wires that carry negative potentials. Therefore, the switching elements 76A are closed, thereby allowing the voltages Es across the respective cells 32 to be measured by the voltage detector 70. While the voltages Es are applied and the battery module 30 is being charged, the voltages applied across the anti-fuse elements 78 (AF1 through AF6) are lower than the threshold voltage Vth. Thus, the anti-fuse elements 78 exhibit a high resistance value.

The voltage monitoring circuit 10A operates in the following manner when the current blocking switch 34 is opened while charging of the battery module 30 is being carried out with a current flowing from the load 50 (regenerative power supply) to the battery module 30.

If the current blocking switch 34 is opened while the battery module 30 is being charged in the regenerative mode, the charging current from the load 50 stops flowing to the battery module 30. At this time, an open-circuit voltage Eregopen, which is a regenerated voltage from the load 50, is applied across the battery module 30. Generally, since the open-circuit voltage Eregopen, which serves as the regenerated voltage, is higher than the voltage 6×Es [V] across the battery module 30 (Eregopen>>6×Es), if the node G shown in FIG. 3 is at the reference potential 0 [V], then a potential Eregopen−3×Es is developed on the line D-D', i.e., at the node D, whereas a potential of only 2×Es is developed on the line E-E', i.e., at the node E, compared with the reference potential at the node G. The potential Eregopen−3×Es on the line D-D', i.e., at the node D, is higher than the potential 2Es at the node E, i.e., (Eregopen−3×Es)>2Es. As a result, the potential at the node E' tends to be higher than the potential of the wire D-D'. The voltage, i.e., the potential of the control signal S4, which is applied to the control terminal 82 of the switching element 76A connected to the wire D-D', remains negative, thereby keeping the switching element 76A closed. In the absence of the anti-fuse element 78 (AF4), the potential difference between the node E' and the node F' increases beyond an input withstand voltage Vinmax, which can cause damage to the voltage detector 70.

However, the voltage monitoring circuit 10A shown in FIG. 3 includes the anti-fuse element 78 (AF4). Thus, when the voltage applied to the control terminal 82 of the switching element 76A decreases, and at the time that the voltage across the anti-fuse element 78 becomes higher than the threshold voltage Vth, the resistance of the anti-fuse element 78 (AF4) quickly and irreversibly changes from a high level to a low level (see FIG. 6A).

When the resistance of the anti-fuse element 78 changes to a low level, the switching element 76A (pMOSFETs Q7, Q7) opens, and the nodes D, D' are connected to each other only by the parasitic diodes, which are reverse-connected to each other in series, so that the wire D-D' is blocked.

Since conduction between the nodes D, D' is broken, the potential at the node D' changes to a potential that is determined by a voltage dividing ratio, which depends on the voltage between the node C' and the node E', and a voltage dividing ratio, which depends on the internal impedance components 84 of the voltage detector 70.

The voltage between the node C (C') and the node D' increases, thereby rendering the anti-fuse element 78 (AF3) conductive and opening the switching element 76A (pMOSFETs Q5, Q6). Similarly, the anti-fuse element 78 (AF2) and the anti-fuse element 78 (AF1) are rendered conductive in succession to thereby open the switching elements 76A (pMOSFETs Q3, Q4 and Q1, Q2). Therefore, the switching elements 76A including the respective anti-fuse elements AF1, AF2, AF3, AF4 are opened. Therefore, a high voltage is not applied to the voltage detector 70, and the voltage detector 70 is protected.

Figure 5:
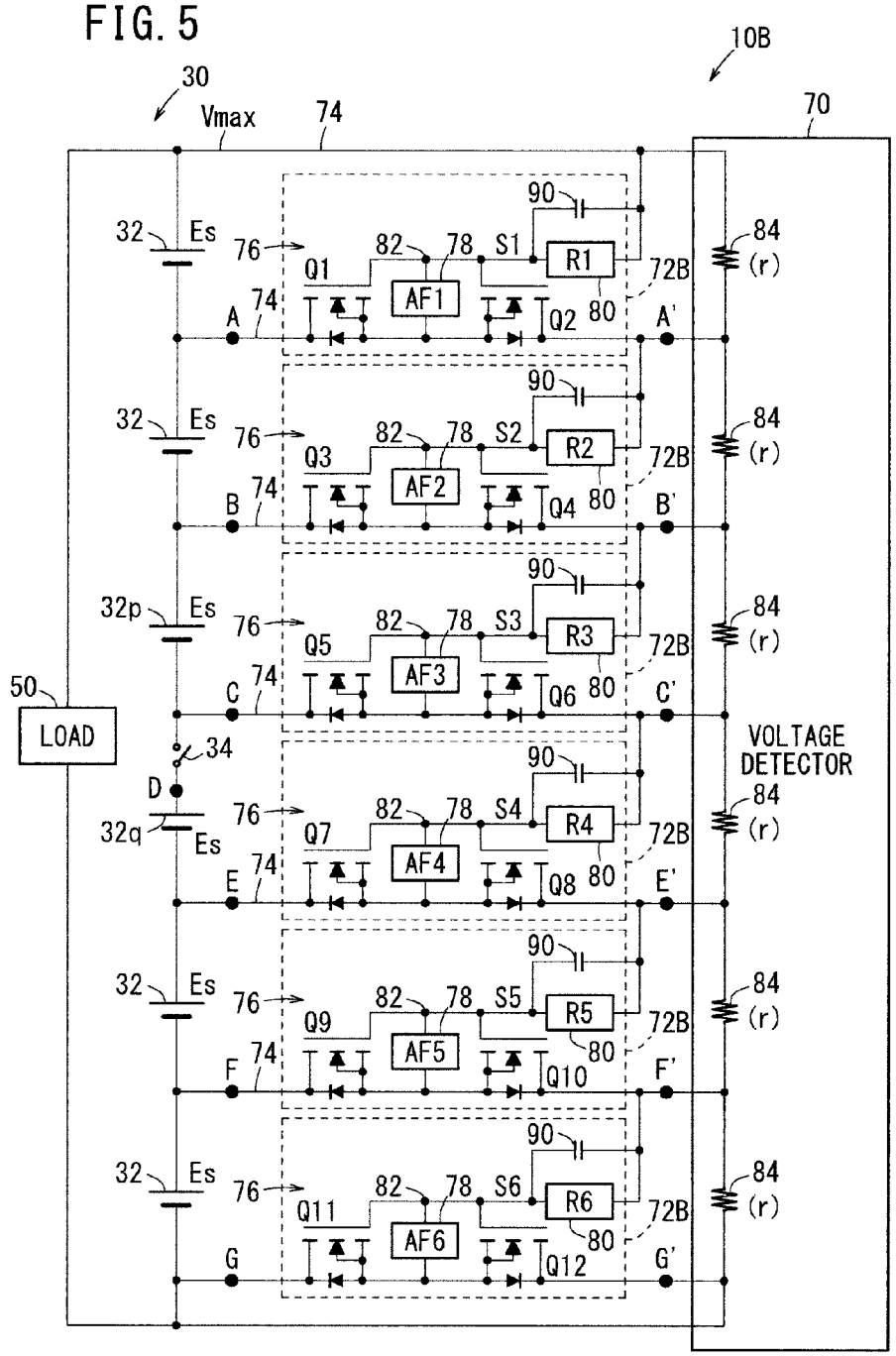
FIG. 5 is an electric circuit diagram of a voltage monitoring circuit according to another embodiment of the present invention.

FIG. 5 shows schematically a voltage monitoring circuit 108 according to another embodiment of the present invention.

The voltage monitoring circuit 10B according to the other embodiment differs from the voltage monitoring circuit 10 shown in FIG. 2, only in that capacitors 90 are connected in parallel with the respective resistive elements 80 (R1 through R6), which interconnect the gate electrodes of the semiconductor switch blocks 72B and adjacent voltage detecting lines.

Components of the other embodiment shown in FIG. 5, which are identical to those shown in FIG. 2, are denoted by identical reference characters and such features will not be described in detail below.

Operations of the voltage monitoring circuit 10B according to the other embodiment shown in FIG. 5 will be described below, in comparison with operations of the voltage monitoring circuit 10 shown in FIG. 2. According to the voltage monitoring circuit 10 shown in FIG. 2, when the current blocking switch 34 is opened while charging of the battery module 30 is carried out with the motor 16 being in the regenerative mode, a leakage current is generated through the anti-fuse element 78 (AF4) at the time that the potential at the node C' increases with respect to the potential of the wire E-E', as indicated at time t0 shown in FIG. 6A. Therefore, the voltage (voltage drop) produced across the resistive element 80 (R4) by the leakage current increases, and the resistance value of the resistive element 80 (R4) also increases, thereby causing the voltage across the anti-fuse element 78 (AF4) to increase slowly.

The time consumed until the anti-fuse element 78 (AF4) is short-circuited is reduced to a period from time t0 to time t4, thereby increasing the time required for the nMOSFETs Q7, Q8 to block the wire E-E'. Unless the voltage between the node C' and the wire E-E' rises, short-circuiting of the anti-fuse element 78 (AF4), i.e., changing the anti-fuse element 78 (AF4) from an open state to a closed state, is delayed.

Figure 6B:
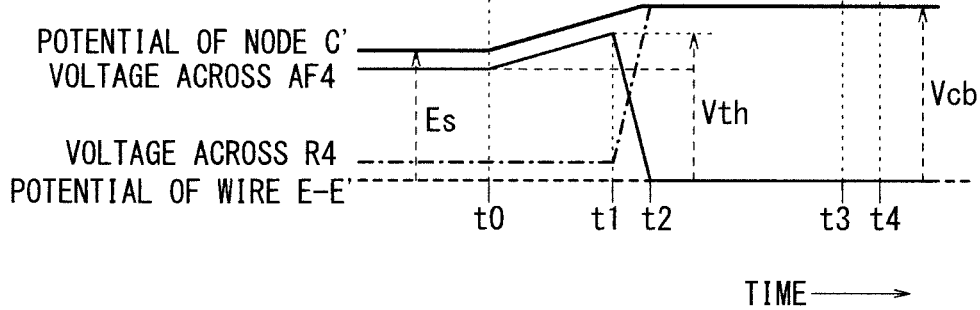
FIG. 6B is a waveform diagram showing operations of the voltage monitoring circuit illustrated in FIG. 5.

However, according to the voltage monitoring circuit 10B shown in FIG. 5, since the capacitors 90 are connected in parallel with the respective resistive elements 80 (R1 through R6), the capacitors 90 prevent the voltage across the resistive element 80 (R4) from increasing due to a leakage current flowing through the anti-fuse element 78 (AF4). As a consequence, the voltage across the anti-fuse element 78 (AF4) increases rapidly, thereby shortening the time required for the switching elements 76 of the semiconductor switch blocks 72B to change from a closed state to an open state, from the period from time t0 to time t4 shown in FIG. 6A to the period from time t0 to time t2 shown in FIG. 6B. Therefore, the voltage applied to the voltage detector 70 is reduced from the voltage Vca (without the capacitors 90) shown in FIG. 6A to the lower voltage Vcb (with the capacitors 90) shown in FIG. 6B.

The capacitors 90 shown in FIG. 5 may be connected in parallel with the resistive elements 80 of the voltage monitoring circuit 10A shown in FIG. 3, which includes p-type semiconductor switches. The resultant modification offers the same advantages as those described above.

According to the embodiments described above, each of the voltage monitoring circuits 10, 10A, 10B monitors voltages across N chargeable and dischargeable series-connected cells of a battery module 30 with a load 50 being connected between a maximum potential Vmax and a minimum potential Vmin of the battery module 30, and a current blocking switch 34 being connected between at least a pair of adjacent ones 32p, 32q of the cells 32. N+1 wires are connected from positive terminal and negative terminals of the cells 32 to the voltage monitoring circuit. Switching elements 76 are connected in series to respective ones of the N+1 wires apart from the wire carrying the maximum potential Vmax or the minimum potential Vmin. The switching elements 76 can be opened and closed responsive to signals S1 through S6 from control lines that are branched from adjacent ones of the respective wires. Resistive elements 80 (R1 through R6) are connected in series respectively to the control lines between the control terminals 82 of the switching elements 76 and the adjacent wires. Anti-fuse elements 78 (AF1 through AF6) are connected respectively between the control terminals 82 and the respective wires, the wires being disconnected and connected when the switching elements 76 are opened and closed.

With the above-described characteristic arrangement, among the N+1 wires that are connected, to the voltage monitoring circuit 10, 10A, 10B (voltage detector 70), from the positive terminals and the negative terminals of the cells 32 that make up the battery module 30, with the load 50 being connected between the maximum potential Vmax and the minimum potential Vmin thereof, wires apart from the wires that carry the maximum potential Vmax or the minimum potential Vmin each include the switching elements 76, which are connected in series and can be opened and closed by control signals S1 through S6 from control lines that branch from adjacent ones of the wires. The resistive elements 80 (R1 through R6) are connected in series to the control lines between control terminals 82 of the switching elements 76 and the adjacent wires. The anti-fuse elements 78 (AF1 through AF6) are connected between the control terminals 82 and the wires, which are disconnected and connected when the switching elements 76 are opened and closed.

In the voltage monitoring circuits 10, 10A, 10B shown in FIGS. 2, 3, and 5, while the current blocking switch 34 is open and the battery module 30 is being discharged, the switching elements 76 are opened if voltages of reverse polarity are applied to the switching elements 76. While the current blocking switch 34 is open and the battery module 30 is being charged, the anti-fuse elements 78 are short-circuited when voltages of normal polarity are applied to the switching elements 76. Consequently, the switching elements 76 are opened during times that the battery module 30 is either being discharged or charged. Therefore, a high voltage is not applied to the voltage monitoring circuits 10, 10A, 10B during charging and discharging of the battery module 30.

Since the capacitors 90 are connected in parallel to the respective resistive elements 80, as shown in FIG. 5, the anti-fuse elements 78 can be short-circuited smoothly in a short time.

If the switching elements 76 comprise n-type semiconductor switches (nMOSFETs Qn, Qn+1 shown in FIGS. 2 and 5), which are closed when positive voltages are applied to the control terminals 82, then the n-type semiconductor switches are connected to N wires apart from the wire carrying the maximum potential Vmax, and are closed by potentials of the control lines (control signals S1 through S6), which are branched from adjacent wires of higher potentials.

If the switching elements 76 comprise p-type semiconductor switches (pMOSFETs Qn, Qn+1 shown in FIG. 3), which are closed when negative voltages are applied to the control terminals 82, then the n-type semiconductor switches are connected to N wires apart from the wire carrying the minimum potential Vmin, and are closed by potentials of the control lines (control signals S1 through S6), which are branched from adjacent wires of lower potentials.

The motor 16 (charging unit, charger) that serves as an electricity generating apparatus may be connected between the maximum potential Vmax and the minimum potential Vmin of the battery module 30 (FIG. 1) for thereby charging the battery module 30. The electricity generating apparatus (charging unit) may comprise the motor 16 (FIG. 1, FIG. 9, to be described below), the engine 14 and an electricity generator 91 (FIG. 7, to be described later), or an FC stack 94 (FIG. 8, to be described below).

The present invention is not limited to the above embodiments, but various arrangements may be adopted based on the described content of the present disclosure.

Figure 7:
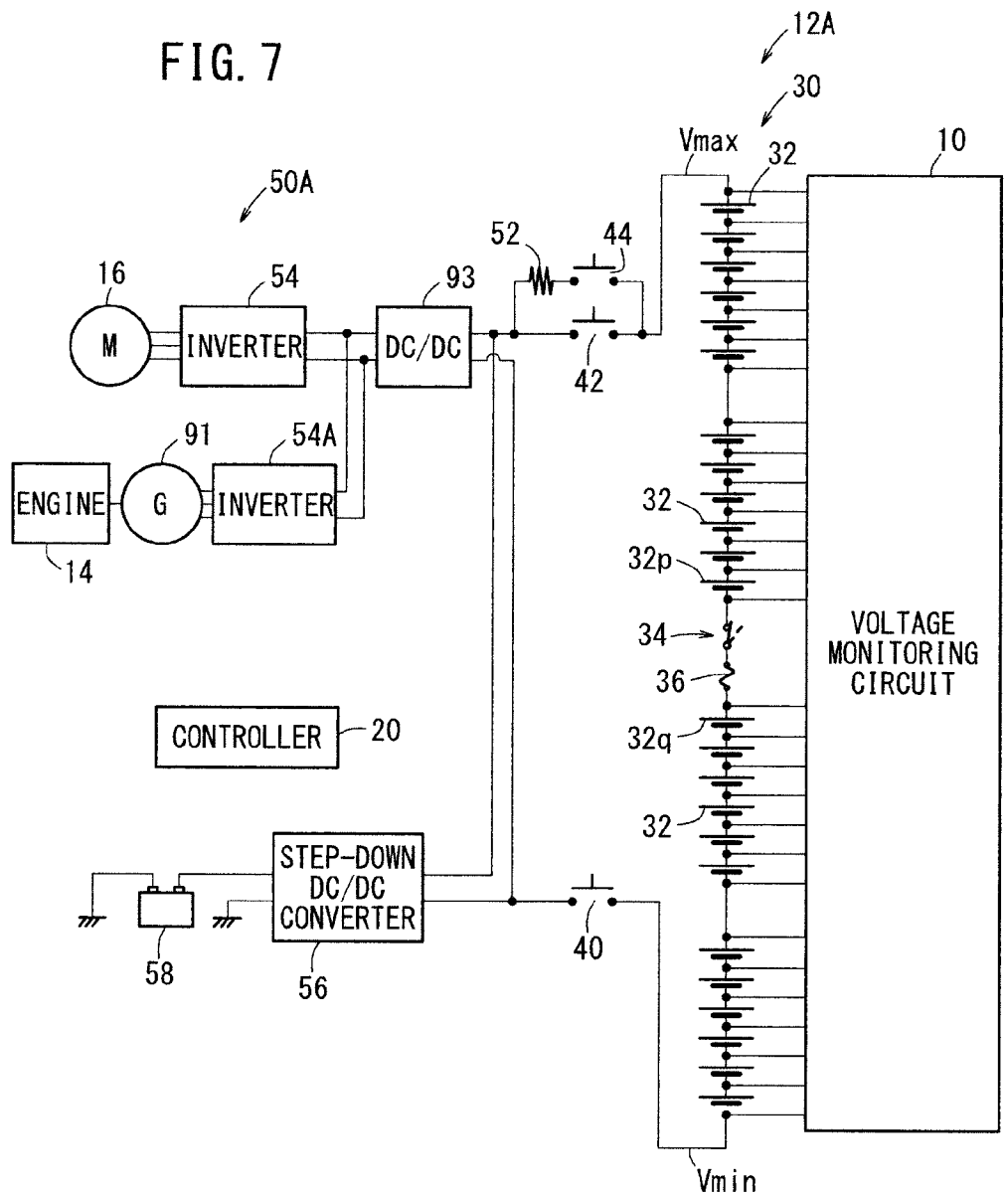
FIG. 7 is an electric circuit diagram of another hybrid vehicle incorporating a voltage monitoring circuit therein.

For example, as shown in FIG. 7, the invention may be applied to a hybrid vehicle (HEV) 12A in which the engine 14 actuates an electricity generator (G) 91 exclusively in order to energize the motor 16 or to charge the battery module 30 through a DC/DC converter 93. The engine 14 and the electricity generator 91 jointly make up a charging unit (charger).

Figure 8:
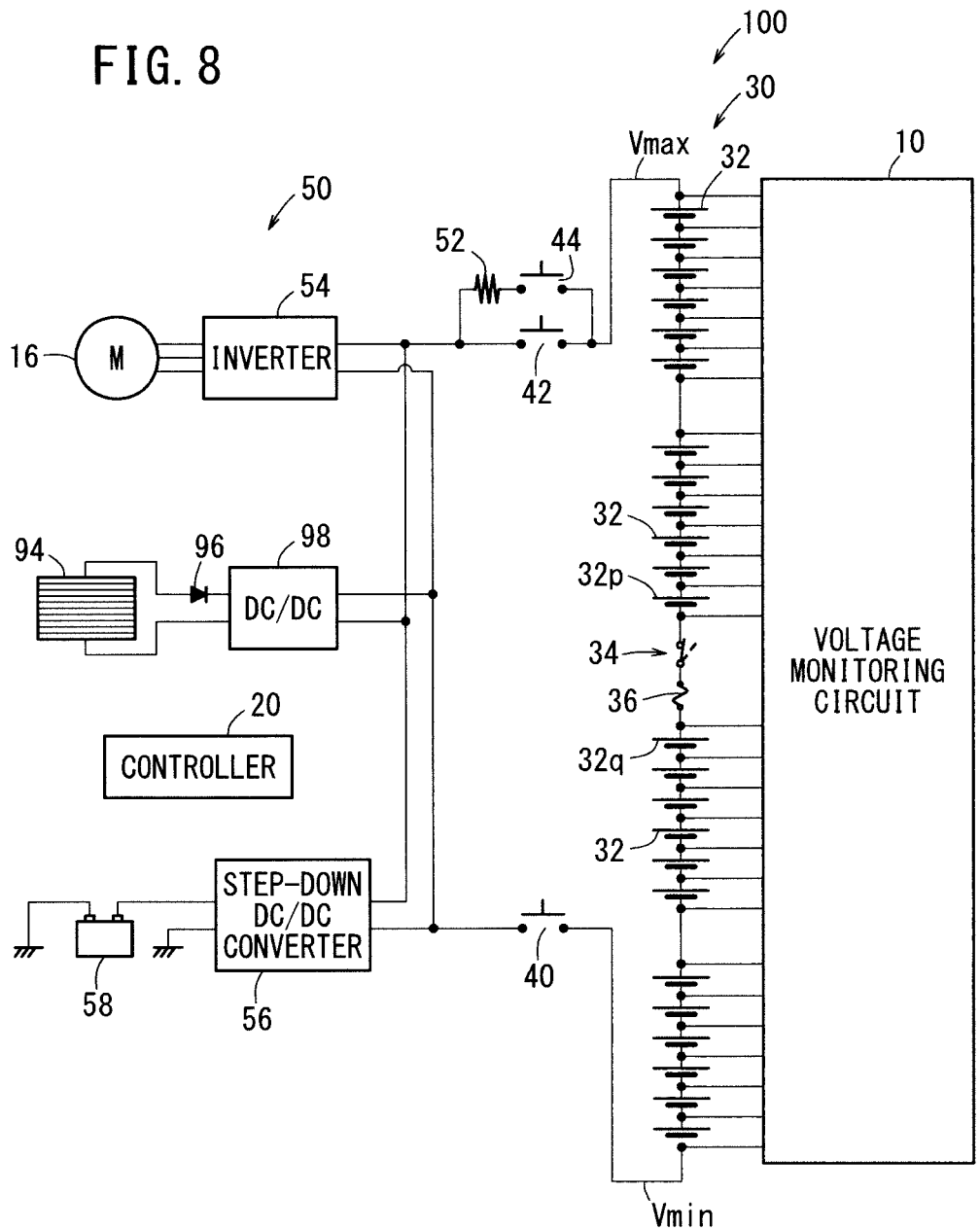
FIG. 8 is an electric circuit diagram of a fuel cell vehicle incorporating a voltage monitoring circuit therein.

Furthermore, as shown in FIG. 8, the invention may be applied to a fuel cell vehicle (FCV) 100, which includes a fuel cell stack (FC stack) 94, a diode 96, and a DC/DC converter 98. The fuel cell stack 94 energizes the motor 16 or charges the battery module 30 through the DC/DC converter 98. The motor 16, the inverter 54, the FC stack 94, and the DC/DC converter 98 jointly make up a charging unit (charger).

Figure 9:
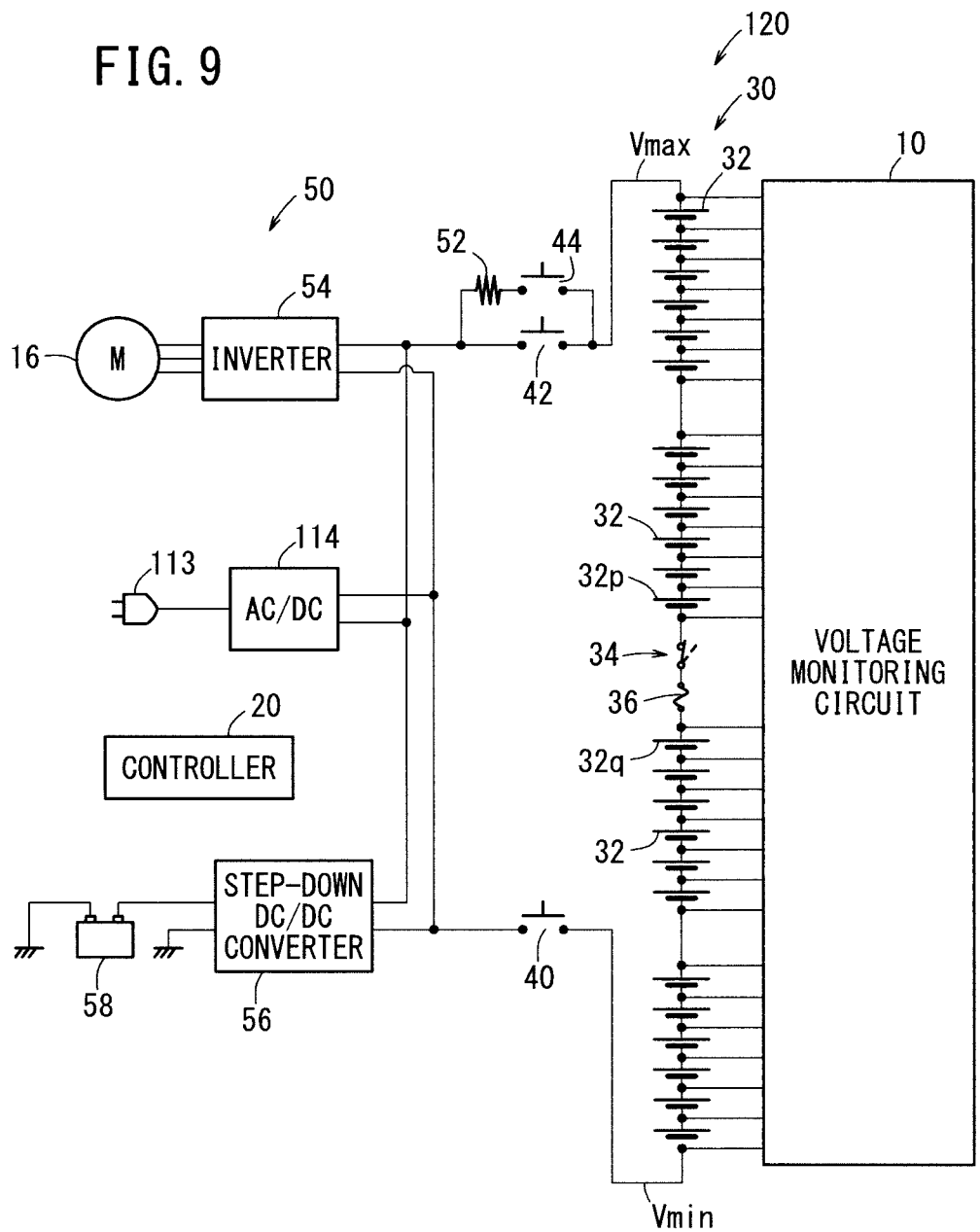
FIG. 9 is an electric circuit diagram of an electric vehicle incorporating a voltage monitoring circuit therein.

Moreover, as shown in FIG. 9, the invention may be applied to an electric vehicle (EV) 120, which has an AC plug (power supply plug) 113 and an A/D converter 114.

Although not shown, the invention may also be applied to a plug-in hybrid vehicle (PHEV) having the AC plug (power supply plug) 113 and the A/D converter 114 shown in FIG. 9.

The invention claimed is:

1. A voltage monitoring circuit for monitoring voltages across N chargeable and dischargeable series-connected cells of a battery module with a load being connected between a maximum potential and a minimum potential of the battery module, and a current blocking switch being connected between at least a pair of adjacent ones of the cells, wherein N+1 wires are connected from positive terminals and negative terminals of the cells to the voltage monitoring circuit, the voltage monitoring circuit comprising:

switching elements connected in series to respective ones of the N+1 wires apart from a wire carrying the maximum potential or the minimum potential, the switching elements being openable and closable by control signals from control lines branched from adjacent ones of the respective wires;

resistive elements connected in series respectively to the control lines between control input terminals of the switching elements and the adjacent ones of the respective wires; and anti-fuse elements connected respectively between the control input terminals and the respective wires, the wires being disconnected and connected when the switching elements are opened and closed.

2. The voltage monitoring circuit according to claim 1, further comprising:

capacitors connected in parallel with the resistive elements, respectively.

3. The voltage monitoring circuit according to claim 1, wherein the switching elements comprise semiconductor switches that are closed when positive voltages are applied to the control input terminals; and the semiconductor switches are connected to the N wires apart from the wire carrying the maximum potential, and are closed by potentials of the control lines that are branched from adjacent wires of higher potentials.

4. The voltage monitoring circuit according to claim 1, wherein the switching elements comprise semiconductor switches that are closed when negative voltages are applied to the control input terminals; and the semiconductor switches are connected to the N wires apart from the wire carrying the minimum potential, and are closed by potentials of the control lines that are branched from adjacent wires of lower potentials.

5. The voltage monitoring circuit according to claim 1, wherein a charging unit for charging the battery module is connected between the maximum potential and the minimum potential of the battery module.

6. A vehicle incorporating:

a voltage monitoring circuit for monitoring voltages across N chargeable and dischargeable series-connected cells of a battery module with a load being connected between a maximum potential and a minimum potential of the battery module, and a current blocking switch being connected between at least a pair of adjacent ones of the cells, wherein N+1 wires are connected from positive terminals and negative terminals of the cells to the voltage monitoring circuit; and a charging unit for charging the battery module and which is connected between the maximum potential and the minimum potential of the battery module, wherein the voltage monitoring circuit comprising:

switching elements connected in series to respective ones of the N+1 wires apart from a wire carrying the maximum potential or the minimum potential, the switching elements being openable and closable by control signals from control lines branched from adjacent ones of the respective wires;

resistive elements connected in series respectively to the control lines between control input terminals of the switching elements and the adjacent ones of the respective wires; and anti-fuse elements connected respectively between the control input terminals and the respective wires, the wires being disconnected and connected when the switching elements are opened and closed.

* * * * *